United States Patent

Huang

(10) Patent No.: US 9,634,677 B2
(45) Date of Patent: Apr. 25, 2017

(54) CLOCK GENERATOR AND INTEGRATED CIRCUIT USING THE SAME AND INJECTION-LOCKED PHASE-LOCKED LOOP CONTROL METHOD

(71) Applicant: MediaTek Inc., Hsin-Chu (TW)

(72) Inventor: Yi-Chieh Huang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/052,183

(22) Filed: Feb. 24, 2016

(65) Prior Publication Data

US 2017/0026048 A1  Jan. 26, 2017

Related U.S. Application Data

(60) Provisional application No. 62/195,924, filed on Jul. 23, 2015.

(51) Int. Cl.
*H03L 7/06* (2006.01)
*H03L 7/099* (2006.01)

(52) U.S. Cl.
CPC .................................. *H03L 7/099* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 7,015,738 B1* | 3/2006 | Cao | ....................... | H03C 3/0925 327/156 |
| 8,604,840 B2* | 12/2013 | Ahmadi | ................ | H03L 7/0891 327/107 |
| 9,461,656 B2* | 10/2016 | Joo | .......................... | H03L 7/087 |
| 9,490,820 B2* | 11/2016 | Shiozaki | ............... | H03L 7/0802 |
| 2009/0015338 A1* | 1/2009 | Frey | ...................... | H03L 7/0802 331/16 |
| 2011/0133799 A1* | 6/2011 | Dunworth | ............... | H03L 7/089 327/157 |
| 2011/0234272 A1* | 9/2011 | Yu | ........................... | H03L 7/089 327/157 |
| 2012/0062293 A1* | 3/2012 | Liang | ........................ | H03L 7/23 327/157 |
| 2014/0103973 A1* | 4/2014 | Kurd | ........................ | G06F 1/08 327/156 |
| 2015/0311908 A1* | 10/2015 | Laaja | ...................... | H03L 7/093 327/159 |

* cited by examiner

*Primary Examiner* — Adam Houston
(74) *Attorney, Agent, or Firm* — McClure, Qualey & Rodack, LLP

(57) ABSTRACT

A control technique for an injection-locked phase-locked loop (ILPLL) includes the following steps: providing the ILPLL with a sampling clock and an injection clock for an integral path and a proportional path of the ILPLL, respectively; making a change in the power level of the injection clock to get the phase error of the integral path of the ILPLL; and controlling the phase difference between the sampling clock and the injection clock based on the phase error of the integral path of the ILPLL.

19 Claims, 6 Drawing Sheets

US 9,634,677 B2

CLOCK GENERATOR AND INTEGRATED CIRCUIT USING THE SAME AND INJECTION-LOCKED PHASE-LOCKED LOOP CONTROL METHOD

CROSS REFERENCE TO RELATED APPLICATIONS

This application claims the benefit of U.S. Provisional Application No. 62/195,924, filed on Jul. 23, 2015, the entirety of which is incorporated by reference herein.

BACKGROUND OF THE INVENTION

Field of the Invention

The present invention relates to a clock generator with an injection-locked phase-locked loop (ILPLL).

Description of the Related Art

There is an increasing demand for modern integrated circuit designs to have a high frequency and a low-jitter clock. Thus, phase-locked loops (PLLs) that have jitter on the order of a few picoseconds have become the preferred choice. To get better phase noise, a wider loop bandwidth is needed to suppress the noise from the voltage-controlled oscillators (VCOs) of the PLLs. In order to achieve a wider loop PLL bandwidth, an injection-locked technique can be introduced in the VCO design of the PLL, to establish an injection-locked phased-locked loop (ILPLL).

ILPLLs are widely used in clock generators. An ILPLL control technique for the generation of a low-jitter clock signal is called for.

BRIEF SUMMARY OF THE INVENTION

A clock generator in accordance with an exemplary embodiment of the disclosure has an injection-locked phase-locked loop (ILPLL) for the generation of an output clock, a pulse-power controller, delay elements, and a delay control circuit. The ILPLL receives a sampling clock and an injection clock for an integral path and a proportional path of the ILPLL, respectively. The pulse-power controller controls the power level of the injection clock. The delay elements are provided for the sampling clock and the injection clock. The delay control circuit is coupled between the ILPLL and the delay elements to control the delay based on the phase error of the integral path of the ILPLL. The phase error is due to a change, caused by the pulse-power controller, in the power level of the injection clock. An integrated circuit in accordance with an exemplary embodiment of the disclosure includes the clock generator and also has a circuit block that is operated according to the output clock of the clock generator.

In an exemplary embodiment, the delay control circuit controls the delay elements to adjust the phase difference between the sampling clock and the injection clock based on the phase error of the integral path of the ILPLL to reduce jitter of the output clock.

A control method for an ILPLL in accordance with an exemplary embodiment of the disclosure includes the following steps: providing the ILPLL with a sampling clock and an injection clock for an integral path and a proportional path of the ILPLL, respectively; and controlling the phase difference between the sampling clock and the injection clock by making a change in the power level of the injection clock to get the phase error of the integral path of the ILPLL.

In an exemplary embodiment, the phase difference between the sampling clock and the injection clock is adjusted to reduce the jitter of the output clock.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
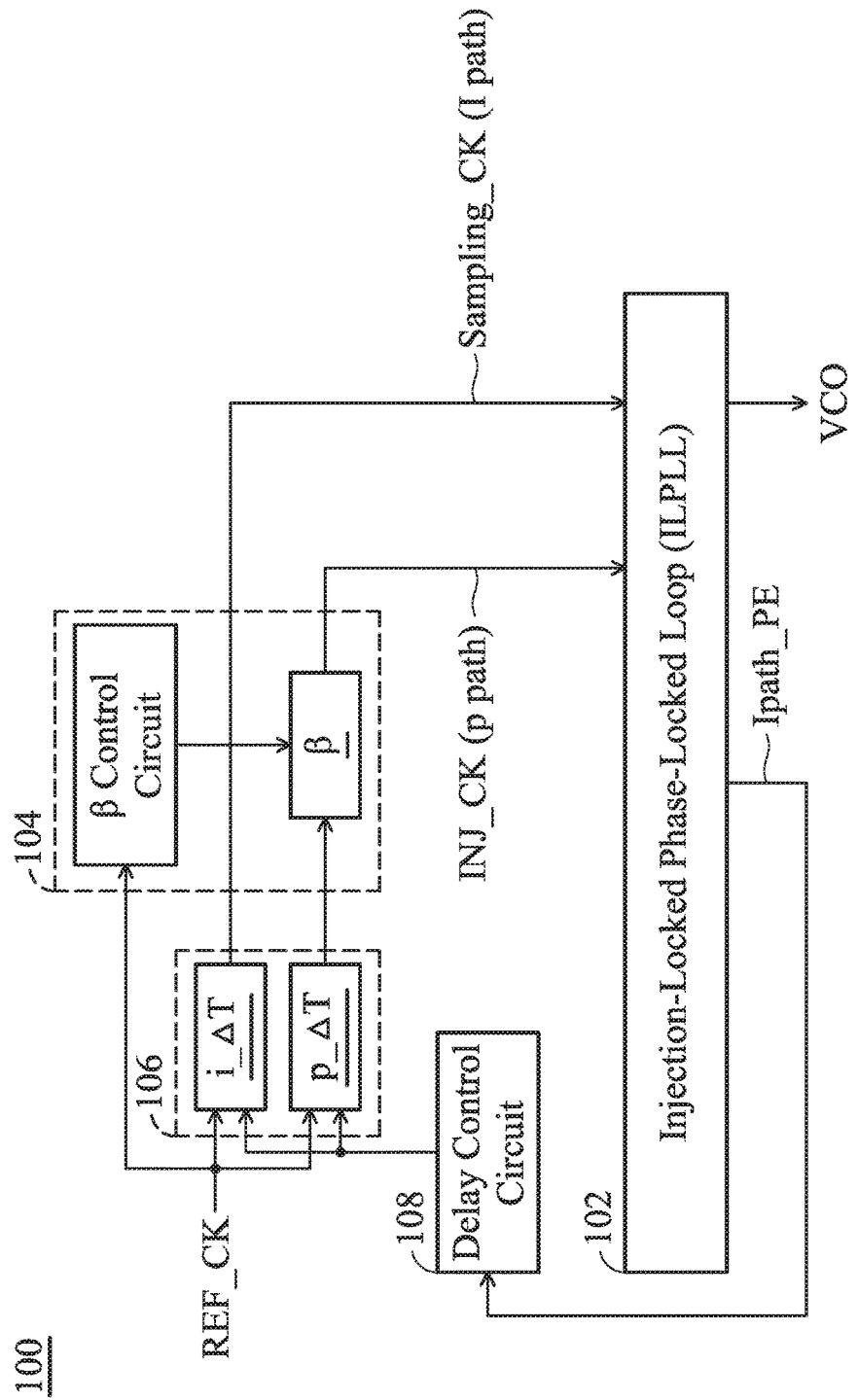
FIG. 1 is a block diagram depicting a clock generator 100 in accordance with an exemplary embodiment of the disclosure.

FIG. 1 is a block diagram depicting a clock generator 100 in accordance with an exemplary embodiment of the disclosure. For the generation of an output clock VCO, an injection-locked phase-locked loop (ILPLL) 102 is used in the clock generator 100. The ILPLL 102 receives a sampling clock Sampling_CK and an injection clock INJ_CK for an integral path (a.k.a., i path) and a proportional path (a.k.a., p path) of the ILPLL 102, respectively. The clock generator 100 also has a pulse-power controller 104 controlling power level β of the injection clock INJ_CK, delay elements 106 for the sampling clock Sampling_CK and the injection clock INJ_CK, and a delay control circuit 108 coupled between the ILPLL 102 and the delay elements 106. The pulse-power controller 104 makes a change (Δβ) in the power level of the injection clock INJ_CK and thereby a phase error Ipath_PE of the integral path (i path) of the ILPLL 102 occurs. The delay control circuit 108 controls the delay elements 106 based on the phase error Ipath_PE of the integral path (i path) of the ILPLL 102. In an exemplary embodiment, the phase difference between the sampling clock Sampling_CK and an injection clock INJ_CK is adjusted to compensate for the phase error Ipath_PE of the integral path (I path) of the IPLL 102. For example, the injection timing of INJ_CK is calibrated to reduce reference spur (jitter). The output clock VCO, therefore, is a low-jitter clock.

In the exemplary embodiment of FIG. 1, a reference clock REF_CK is delayed by a time delay i_ΔT to generate the sampling clock Sampling_CK and delayed by a time delay p_ΔT and adjusted in magnitude to generate the injection clock INJ_CK. The pulse-power controller 104 also receives the reference clock REF_CK to make the change (Δβ) in the power level of the injection clock INJ_CK every N cycles of the injection clock INJ_CK, wherein N is a integer number. During the other cycles of the injection clock INJ_CK without the change (Δβ) in the power level of the injection clock INJ_CK, the delay control circuit 108 controlling the delay elements 106 may keep the adjusted phase difference between the sampling clock Sampling_CK and the injection clock INJ_CK to make no change on the phase difference between the sampling clock Sampling_CK and the injection clock INJ_CK.

In an exemplary embodiment, the pulse-power controller 104 deviates the power level β of the injection clock INJ_CK from the desired level to cause the change (Δβ) in the power level of the injection clock INJ_CK and thereby the phase error Ipath_PE of the integral path of the injection-locked phase-locked loop 102 is observable. The pulse-power controller 104 may reduce the power level β of the injection clock INJ_CK (e.g., reducing the magnitude of the injection clock INJ_CK) to cause the change (Δβ) in the power level of the injection clock INJ_CK.

In an exemplary embodiment, the delay elements 106 are digitally-controlled delay lines (DCDLs).

Figure 2:
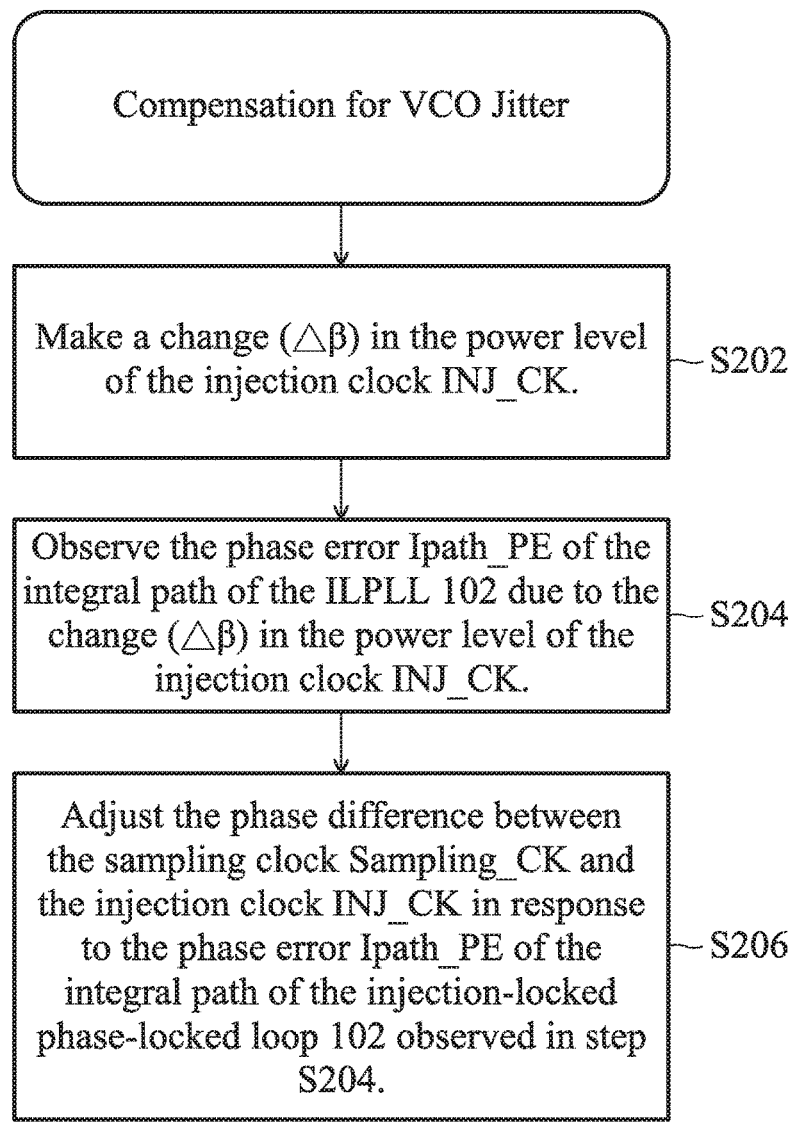
FIG. 2 is a flowchart depicting how to compensate for the jitter of the output clock VCO with respect to the clock generating architecture of FIG. 1.

FIG. 2 is a flowchart depicting how to compensate for the jitter of the output clock VCO with respect to the clock generating architecture of FIG. 1. In step S202, the change (Δβ) is made in the power level of the injection clock INJ_CK. In step S204, the phase error Ipath_PE of the integral path of the injection-locked phase-locked loop 102 due to the change (Δβ) in the power level of the injection clock INJ_CK is observed. In step S206, the phase difference between the sampling clock Sampling_CK and the injection clock INJ_CK is adjusted in response to the phase error Ipath_PE of the integral path of the injection-locked phase-locked loop 102 observed in step S204. Thus, the clock mismatch between the sampling clock Sampling_CK and the injection clock INJ_CK is adjusted. The jitter of the output clock VCO is properly suppressed. The procedure of FIG. 2 may be only repeated every N cycles of the injection clock INJ_CK. In an exemplary embodiment, an injection timing of INJ_CK is calibrated to reduce reference spur (jitter).

Figure 3:
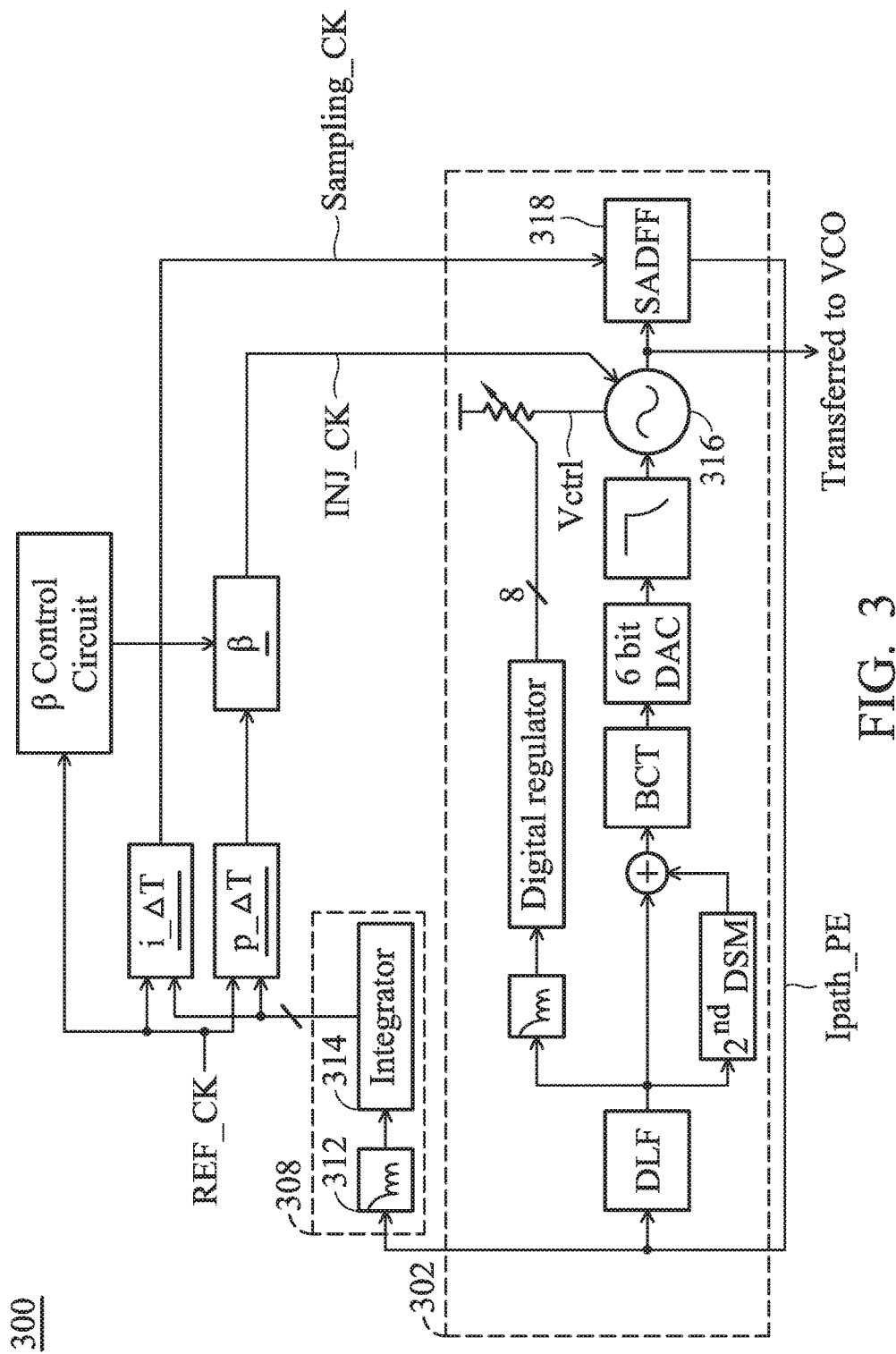
FIG. 3 depicts a clock generator 300 in accordance with another exemplary embodiment of the disclosure.

FIG. 3 depicts a clock generator 300 in accordance with another exemplary embodiment of the disclosure, in which a digital ILPLL 302 is introduced and the delay control circuit 308 has a finite response (FIR) filter 312 and an integrator 314. The digitally-sampled phase error Ipath_PE is filtered and integrated by the FIR filter 312 and the integrator 314 to control the phase difference between the sampling clock Sampling_CK and the injection clock INJ_CK. The ILPLL 302 includes an injection-locked voltage-controlled oscillator (ILVCO) 316 and a sense amplifier D flip-flop (SADFF) 318. The ILVCO 316 controlled by a control voltage Vctrl receives the injection clock INJ_CK for injection locking of the output clock VCO. The SADFF 318 is operated according to the sampling clock Sampling_CK.

Figure 4:
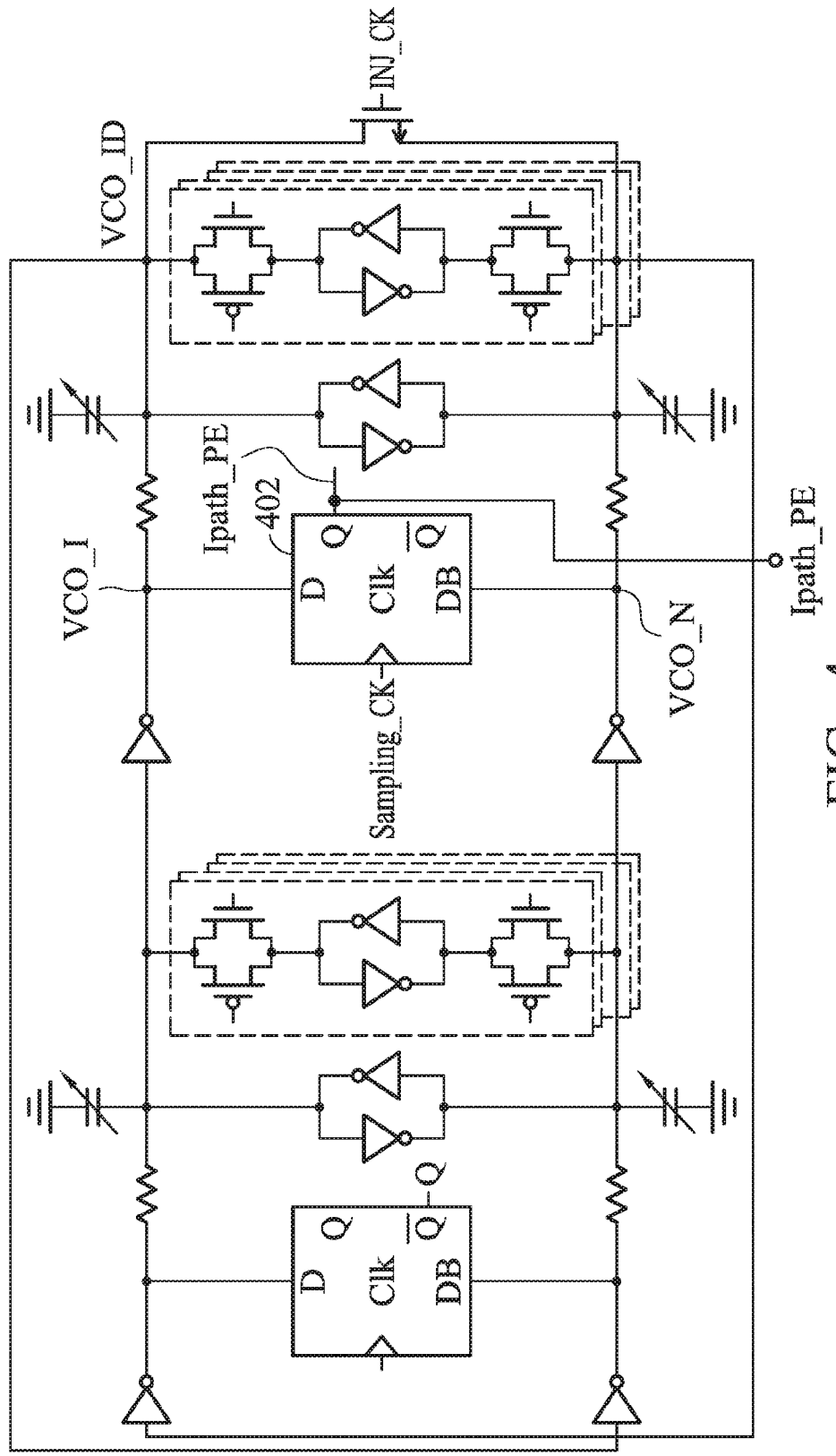
FIG. 4 shows the structure of the ILVCO 316 and the SADFF 318 in accordance with an exemplary embodiment of the disclosure.
Figure 5:
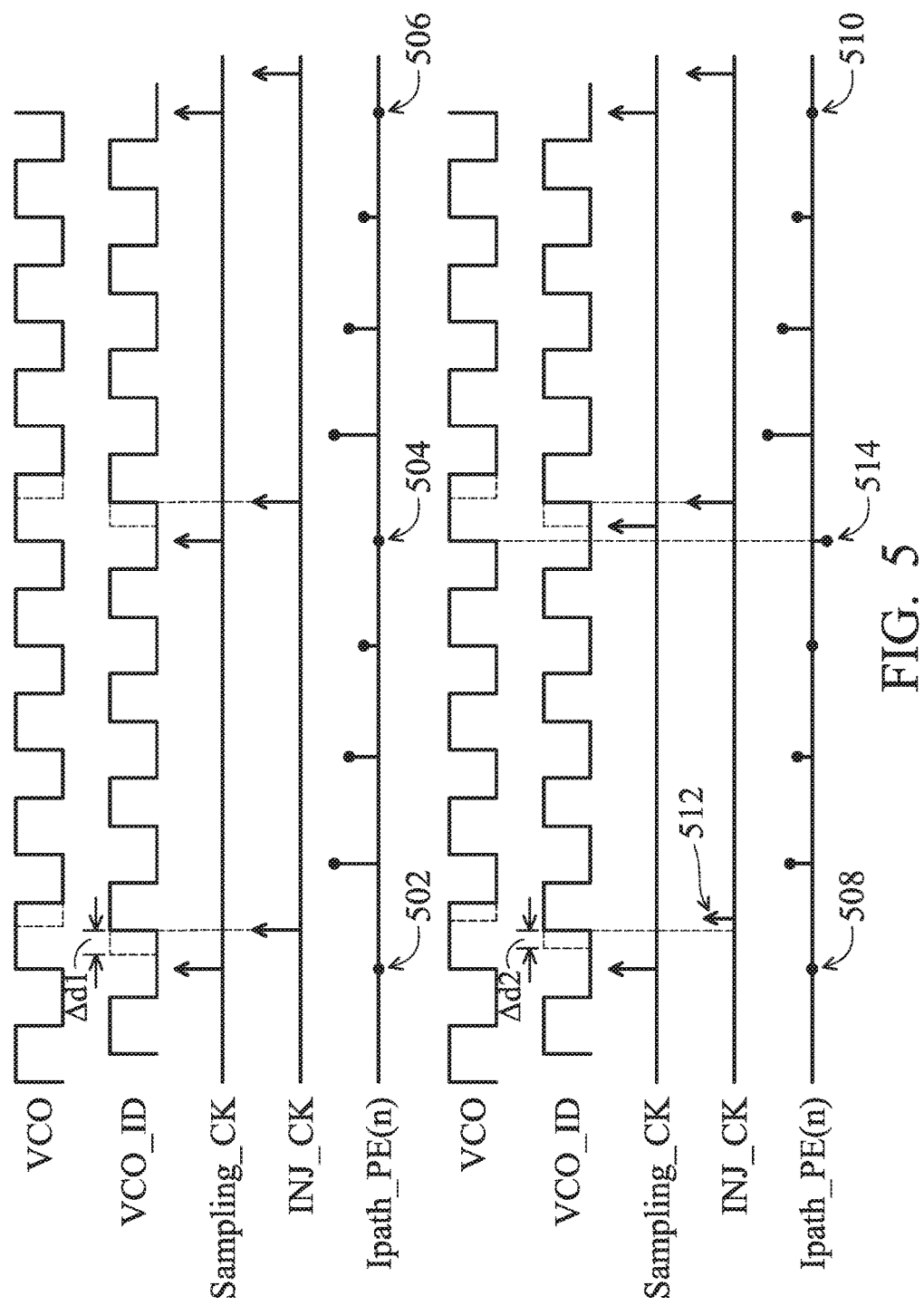
FIG. 5 shows waveforms of the signals of FIG. 4.

FIG. 4 shows the structure of the ILVCO 316 and the SADFF 318 in accordance with an exemplary embodiment of the disclosure. Oscillation signals VCO_I and VCO_N are generated by the ILVCO 316 to be transformed to the output clock VCO. A flip-flop 402 provided by the SADFF 318 has a D terminal 'D' receiving the oscillation signal VCO_I, a DB terminal 'DB' receiving the oscillation signal VCO_N, a clock terminal '$\overline{Q}$' receiving the sampling clock Sampling_CK, a Q terminal 'Q' outputting the phase error Ipath_PE of the integral path of the injection-locked phase-locked loop 302, and a QB terminal '$\overline{Q}$'. In the structure of FIG. 4, the sampling clock Sampling_CK is expected to lock to the rising edge of the oscillation signal VCO_I and the injection clock INJ_CK is expected to lock to the rising edge of the oscillation signal VCO ID. FIG. 5 shows waveforms of the signals of FIG. 4. In normal operations (with a normal power level β on the injection clock INJ_CK), the phase error Ipath_PE(n) sampled according to the sampling clock Sampling_CK as indicated by numbers 502, 504, 506, 508 and 510 is unobservable. As shown, the change (Δβ) is made on the injection clock INJ_CK as indicated by number 512. In response to the reduced power level of the injection clock INJ_CK (as indicated by number 512), the phase shift made on the oscillation signal VCO ID is reduced (from Ad1 to Ad2) and thereby an observable phase error Ipath_PE(n) sampled according to the sampling clock Sampling_CK as indicated by number 514 is generated. The phase difference between the sampling clock Sampling_CK and the injection clock INJ_CK is adjusted based on the polarity of phase error Ipath_PE(n) sampled according to the sampling clock Sampling_CK as indicated by number 514 and thereby the mismatch between the sampling clock Sampling_CK and the injection clock INJ_CK is effectively compensated for and the reference spur (jitter) of the output clock VCO is effectively reduced.

Figure 6:
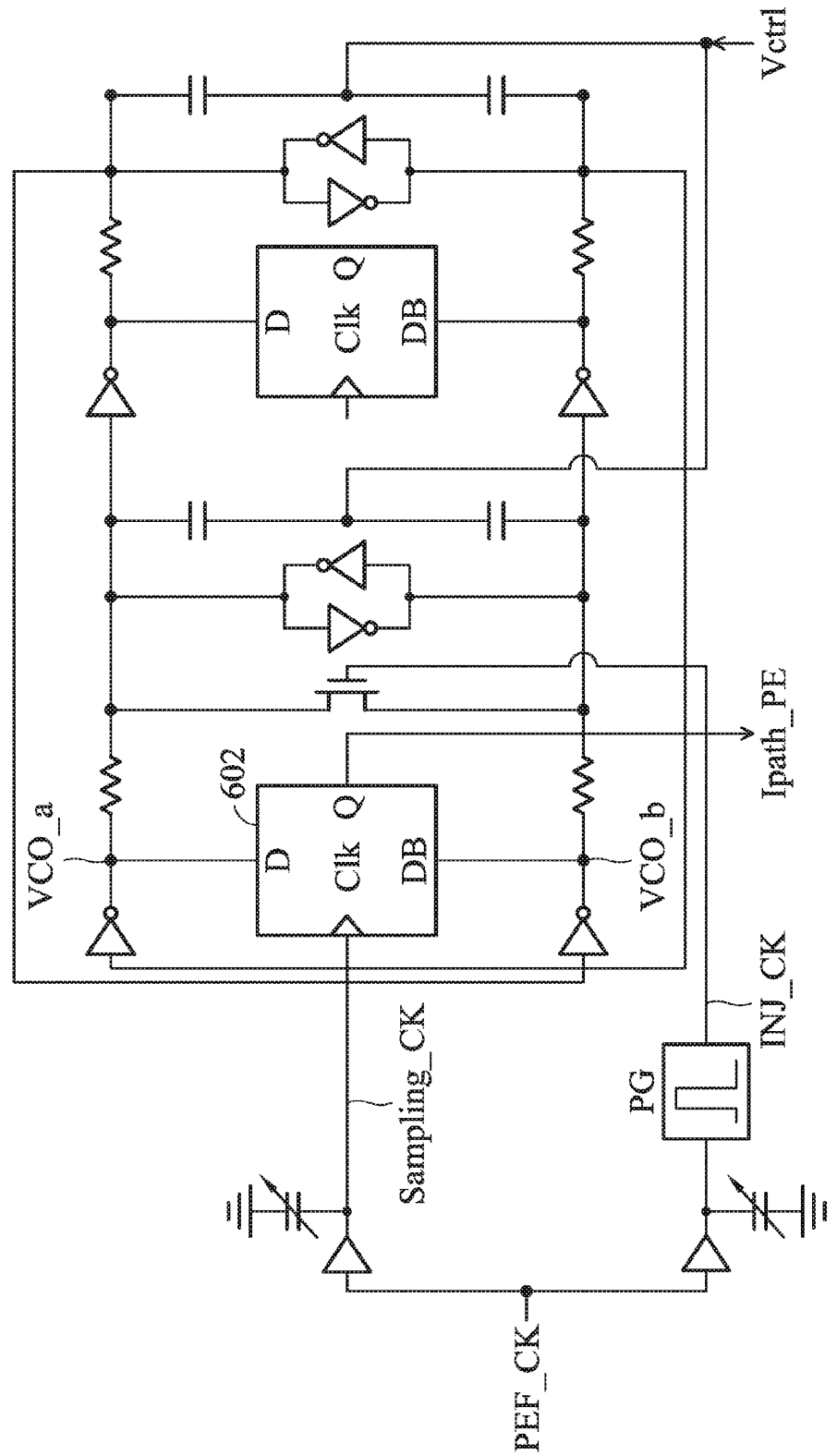
FIG. 6 shows the structure of the ILVCO 316 and the SADFF 318 in accordance with another exemplary embodiment of the disclosure.

FIG. 6 shows the structure of the ILVCO 316 and the SADFF 318 in accordance with another exemplary embodiment of the disclosure. Oscillation signals VCO_a and VCO_b are generated by the ILVCO 316 to be transformed to the output clock VCO. A flip-flop 602 provided by the SADFF 318 has a D terminal 'D' receiving the oscillation signal VCO_a, a DB terminal 'DB' receiving the oscillation signal VCO b, a clock terminal 'elk' receiving the sampling clock Sampling_CK and a Q terminal 'Q' outputting the phase error Ipath_PE of the integral path of the injection-locked phase-locked loop 302.

In another exemplary embodiment, a control method for an ILPLL (e.g. 102) is also introduced in this disclosure, which includes the following steps: providing the ILPLL 102 with a sampling clock Sampling_CK and an injection clock INJ_CK for an integral path and a proportional path of the ILPLL 102, respectively; and controlling the phase difference between the sampling clock Sampling_CK and an injection clock INJ_CK based on the phase error Ipath_PE of the integral path of the ILPLL 102 by making a change (Δβ) in the power level of the injection clock INJ_CK to get the phase error Ipath_PE of the integral path of the ILPLL 102.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A clock generator, comprising:
an injection-locked phase-locked loop for generation of an output clock, receiving a sampling clock and an injection clock for an integral path and a proportional path of the injection-locked phase-locked loop, respectively;
a pulse-power controller, controlling power level of the injection clock;

delay elements for the sampling clock and the injection clock; and a delay control circuit, coupled between the injection-locked phase-locked loop and the delay elements to control the delay elements based on a phase error of the integral path of the injection-locked phase-locked loop, wherein the phase error is due to a change, caused by the pulse-power controller, in the power level of the injection clock.

2. The clock generator as claimed in claim 1, wherein:
the delay control circuit controls the delay elements to adjust a phase difference between the sampling clock and the injection clock based on the phase error of the integral path of the injection-locked phase-locked loop to reduce reference spur of the output clock.

3. The clock generator as claimed in claim 2, wherein:
the pulse-power controller makes the change in the power level of the injection clock every N cycles of the injection clock; and
N is an integer number.

4. The clock generator as claimed in claim 3, wherein:
during the other cycles of the injection clock without the change in the power level of the injection clock, the delay control circuit controlling the delay elements makes no change on the phase difference between the sampling clock and the injection clock.

5. The clock generator as claimed in claim 2, wherein:
the pulse-power controller deviates the power level of the injection clock from a desired level to cause the change in the power level of the injection clock and thereby the phase error of the integral path of the injection-locked phase-locked loop is observable.

6. The clock generator as claimed in claim 5, wherein:
the pulse-power controller reduces the power level of the injection clock to cause the change in the power level of the injection clock.

7. The clock generator as claimed in claim 2, wherein:
the delay elements are digitally-controlled delay lines.

8. The clock generator as claimed in claim 2, wherein the injection-locked phase-locked loop comprises:
an injection-locked voltage-controlled oscillator receiving the injection clock for injection locking of the output clock; and
a flip-flop, having a D terminal receiving a first oscillation signal from the injection-locked voltage-controlled oscillator, a DB terminal receiving a second oscillation signal from the injection-locked voltage-controlled oscillator, a clock terminal receiving the sampling clock and a Q terminal outputting the phase error of the integral path of the injection-locked phase-locked loop.

9. The clock generator as claimed in claim 8, wherein:
the first oscillation signal and the second oscillation signal are transformed to the output clock.

10. The clock generator as claimed in claim 9, wherein:
the flip-flop is a sense amplifier D flip-flop.

11. The clock generator as claimed in claim 2, wherein the injection-locked phase-locked loop comprises:
an injection-locked voltage-controlled oscillator receiving the injection clock for injection locking of the output clock; and
a flip-flop, sampling an oscillation signal from the injection-locked voltage-controlled oscillator according to the sampling clock to provide the delay control circuit with the phase error of the integral path of the injection-locked phase-locked loop.

12. A control method for an injection-locked phase-locked loop for generation of an output clock, comprising:

providing the injection-locked phase-locked loop with a sampling clock and an injection clock for an integral path and a proportional path of the injection-locked phase-locked loop, respectively; and controlling a phase difference between the sampling clock and the injection clock based on the phase error of the integral path of the injection-locked phase-locked loop by making a change in the power level of the injection clock to get a phase error of the integral path of the injection-locked phase-locked loop.

13. The control method as claimed in claim 12, wherein:
the phase difference between the sampling clock and the injection clock is adjusted to reduce reference spur of the output clock.

14. The control method as claimed in claim 13, further comprising:
making the change in the power level of the injection clock every N cycles of the injection clock, where N is an integer number.

15. The control method as claimed in claim 14, wherein:
during the other cycles of the injection clock without the change in the power level of the injection clock, no change is made on the phase difference between the sampling clock and the injection clock.

16. The control method as claimed in claim 13, wherein:
the change in the power level of the injection clock is caused from deviating power level of the injection clock from the desired level and thereby the phase error of the integral path of the injection-locked phase-locked loop is observable.

17. The control method as claimed in claim 16, wherein:
the change in the power level of the injection clock is caused from reducing the power level of the injection clock.

18. The control method as claimed in claim 13, furthering comprising:
providing an injection-locked voltage-controlled oscillator and a flip-flop within the injection-locked phase-locked loop,
wherein:
the injection-locked voltage-controlled oscillator receives the injection clock for injection locking of the output clock; and
the flip-flop has a D terminal receiving a first oscillation signal from the injection-locked voltage-controlled oscillator, a DB terminal receiving a second oscillation signal from the injection-locked voltage-controlled oscillator, a clock terminal receiving the sampling clock, and a Q terminal outputting the phase error of the integral path of the injection-locked phase-locked loop.

19. The control method as claimed in claim 13, furthering comprising:
providing an injection-locked voltage-controlled oscillator and a flip-flop within the injection-locked phase-locked loop,
wherein:
the injection-locked voltage-controlled oscillator receives the injection clock for injection locking of the output clock; and
the flip-flop samples an oscillation signal from the injection-locked voltage-controlled oscillator according to the sampling clock to output a signal indicating the phase error of the integral path of the injection-locked phase-locked loop.

* * * * *